(12) United States Patent
Nakagawa

(10) Patent No.: US 11,275,283 B2
(45) Date of Patent: Mar. 15, 2022

(54) DISPLAY DEVICE HAVING A GATE LEAD LINE

(71) Applicant: Panasonic Liquid Crystal Display Co., Ltd., Hyogo (JP)

(72) Inventor: Teruhisa Nakagawa, Hyogo (JP)

(73) Assignee: PANASONIC LIQUID CRYSTAL DISPLAY CO., LTD., Hyogo (JP)

( * ) Notice: Subject to any disclaimer, the term of this patent is extended or adjusted under 35 U.S.C. 154(b) by 20 days.

(21) Appl. No.: 16/777,030

(22) Filed: Jan. 30, 2020

(65) Prior Publication Data

US 2020/0310208 A1 Oct. 1, 2020

(30) Foreign Application Priority Data

Mar. 28, 2019 (JP) .............................. JP2019-063282

(51) Int. Cl.

| G02F 1/1333 | (2006.01) |
|---|---|
| G02F 1/1362 | (2006.01) |
| G02F 1/1368 | (2006.01) |
| G02F 1/1343 | (2006.01) |
| H01L 27/12 | (2006.01) |
| G02F 1/1345 | (2006.01) |
| G02F 1/1339 | (2006.01) |

(52) U.S. Cl.
CPC ...... *G02F 1/136286* (2013.01); *G02F 1/1368* (2013.01); *G02F 1/134336* (2013.01); *H01L 27/124* (2013.01); *G02F 1/13394* (2013.01); *G02F 1/13452* (2013.01); *G02F 1/13456* (2021.01); *G02F 2201/123* (2013.01); *G09G 2310/021* (2013.01)

(58) Field of Classification Search
CPC .......... G02F 1/136286; G02F 1/13452; H01L 27/124; G09G 2310/021
See application file for complete search history.

(56) References Cited

U.S. PATENT DOCUMENTS

| 8,816,350 | B2* | 8/2014 | Sugihara | ........... G02F 1/136286 257/72 |
|---|---|---|---|---|
| 10,133,138 | B2* | 11/2018 | Oh | ..................... G02F 1/134336 |
| 2014/0168553 | A1 | 6/2014 | Park et al. | |
| 2017/0148404 | A1* | 5/2017 | Xing | .................... G09G 3/3688 |
| 2017/0276990 | A1* | 9/2017 | Chen | ................. G02F 1/133707 |

FOREIGN PATENT DOCUMENTS

JP 2014-119754 6/2014

\* cited by examiner

*Primary Examiner* — Paisley L Wilson
(74) *Attorney, Agent, or Firm* — Wenderoth, Lind & Ponack, L.L.P.

(57) ABSTRACT

A display device comprising: a first pixel row including a first pixel electrode and a second pixel electrode arranged in a first direction; a second pixel row including a third pixel electrode and a fourth pixel electrode arranged in the first direction; a third pixel row including a fifth pixel electrode and a sixth pixel electrode arranged in the first direction; a first source line and a second source line extending in the second direction between the first pixel electrode and the second pixel electrode; a first gate line extending in the first direction between the first pixel row and the second pixel row; a second gate line extending in the first direction between the second pixel row and the third pixel row; and a gate lead line extending in the second direction and connected to the first gate line and the second gate line.

8 Claims, 8 Drawing Sheets

DISPLAY DEVICE HAVING A GATE LEAD LINE

CROSS-REFERENCE TO RELATED APPLICATION

This application claims priority from Japanese application JP 2019-063282, filed Mar. 28, 2019. This Japanese application is incorporated herein by reference.

BACKGROUND

1. Technical Field

The present disclosure relates to a display device.

2. Description of the Related Art

Conventionally, in a display device such as a liquid crystal display device, a technique for a so-called narrower frame has been proposed to reduce the area of a frame region around a display region. For example, Unexamined Japanese Patent Publication No. 2014-119754 discloses a configuration for achieving a narrower frame by disposing a gate driver and a source driver at one side of a display region.

For example, Unexamined Japanese Patent Publication No. 2014-119754 discloses a configuration including a source line extending in a vertical direction from a source driver, a gate lead line running parallel to the source line, and a gate line electrically connected to the gate lead line and extending in a direction perpendicular to an extending direction of the source line. The gate line is supplied with a gate signal via the gate lead line. Such a configuration allows a gate driver to be disposed at the same side of a display region as the source driver.

SUMMARY

The configuration disclosed in Unexamined Japanese Patent Publication No. 2014-119754 has had a problem that an aperture ratio is low. That is, the above-described conventional configuration has had a problem that the aperture ratio is decreased depending on the area of a region where the gate lead line is disposed.

The present disclosure has been made in view of the above circumstances, and an object of the present disclosure is to suppress a decrease in the aperture ratio in a display device having a gate lead line.

A display device according to the present disclosure comprises: a first pixel row including a first pixel electrode and a second pixel electrode that are arranged in a first direction; a second pixel row including a third pixel electrode and a fourth pixel electrode that are arranged in the first direction, the second pixel row being adjacent to the first pixel row in a second direction intersecting the first direction; a third pixel row including a fifth pixel electrode and a sixth pixel electrode that are arranged in the first direction, the third pixel row being adjacent to the second pixel row in the second direction; a first source line and a second source line extending in the second direction between the first pixel electrode and the second pixel electrode, between the third pixel electrode and the fourth pixel electrode, and between the fifth pixel electrode and the sixth pixel electrode; a first gate line extending in the first direction between the first pixel row and the second pixel row; a second gate line extending in the first direction between the second pixel row and the third pixel row; and a gate lead line extending in the second direction and connected to the first gate line and the second gate line.

The display device according to the present disclosure can suppress a decrease in the aperture ratio.

Hereinafter, an exemplary embodiment of the present disclosure will be described with reference to the drawings. In the exemplary embodiment, a liquid crystal display device is described as an example of display device. However the present disclosure is not limited to the liquid crystal display device. For example the present disclosure may be an organic electroluminescence display (OLED) device.

First Exemplary Embodiment

Figure 1:
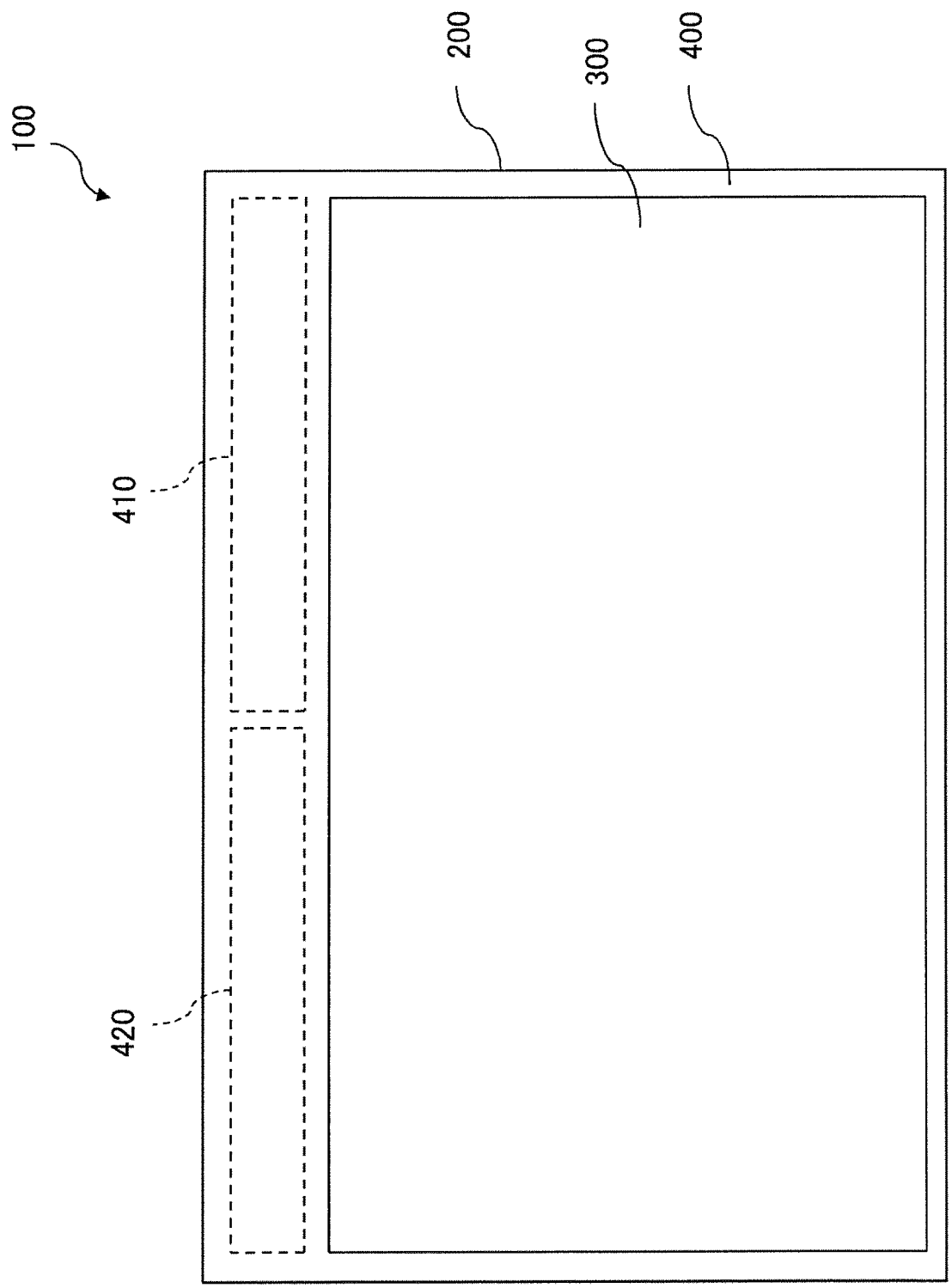
FIG. 1 is a plan view showing a schematic configuration of display device according to a first exemplary embodiment.

FIG. 1 is a plan view showing a schematic configuration of display device 100 according to a first exemplary embodiment. Display device 100 mainly includes display panel 200 and a backlight (not illustrated) disposed on a back surface side of display panel 200. Display panel 200 includes, when roughly classified by region, display region 300 that displays an image and frame region 400 that is located around the display region 300.

On one side of frame region 400, source driver 410 that supplies a source signal to a plurality of source lines and gate driver 420 that supplies a gate signal to a plurality of gate lines are disposed. The present exemplary embodiment exemplifies a configuration in which source driver 410 and gate driver 420 are disposed on one common side. However, source driver 410 may be disposed on one side and gate driver 420 may be disposed on another side, the sides being opposite each other.

Figure 2:
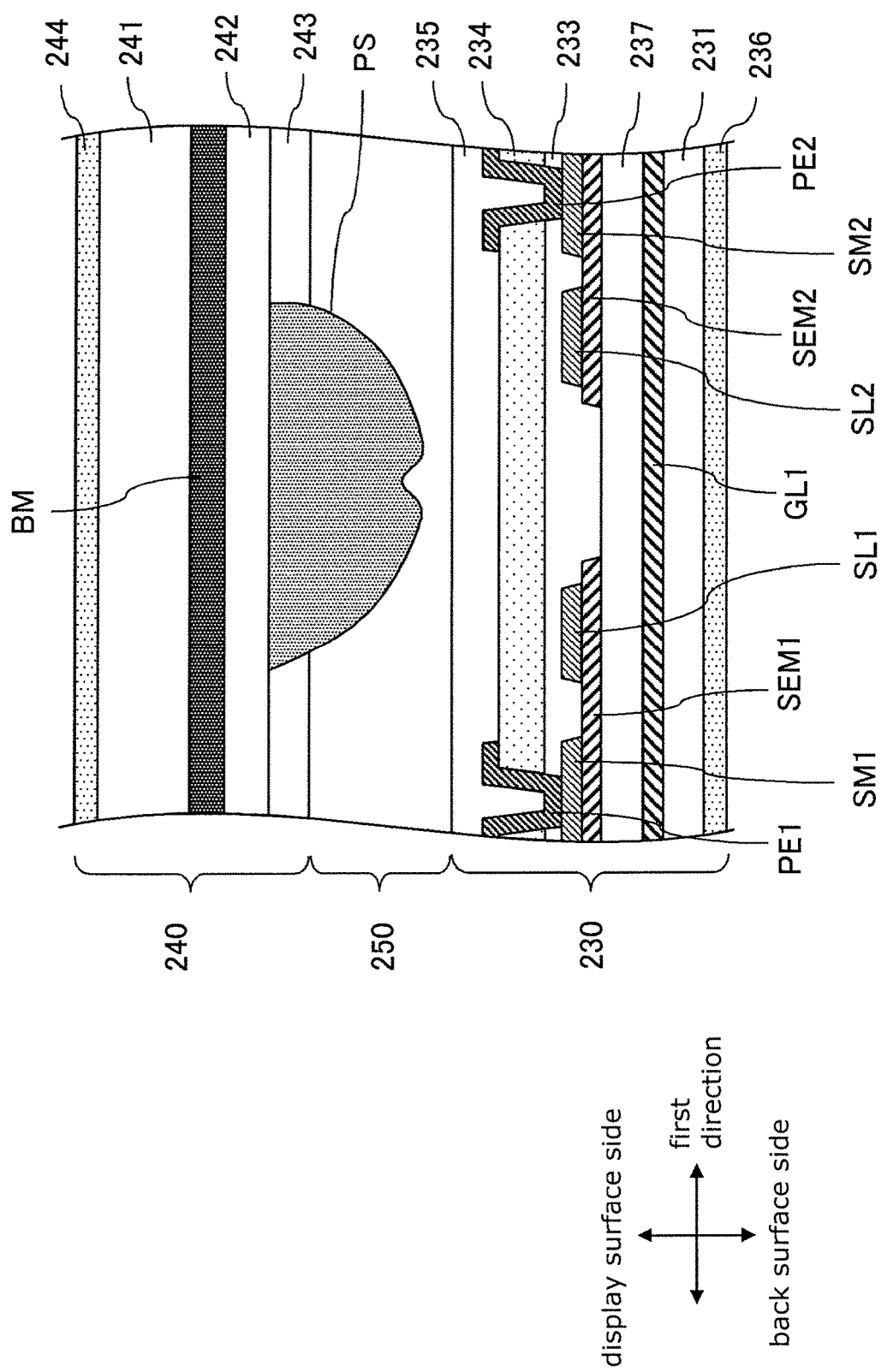
FIG. 2 is a schematic sectional view showing a position of spacer in display device according to the first exemplary embodiment.

FIG. 2 is a schematic sectional view showing a position of spacer PS in display device 100 in the first exemplary embodiment. In the present exemplary embodiment, display device 100 includes thin film transistor substrate 230 that is a first substrate and counter substrate 240 that faces thin film transistor substrate 230. Liquid crystal layer 250 is disposed between thin film transistor substrate 230 and counter substrate 240. On the back surface side of counter substrate 240, there are a plurality of spacers PS protruding toward thin film transistor substrate 230. Spacer PS serves to retain a gap between thin film transistor substrate 230 and counter substrate 240 in a display region. Spacer PS can be formed of an insulating film made of resin, for example. Details of the sectional structure shown in FIG. 2 will be described later.

Figure 3:
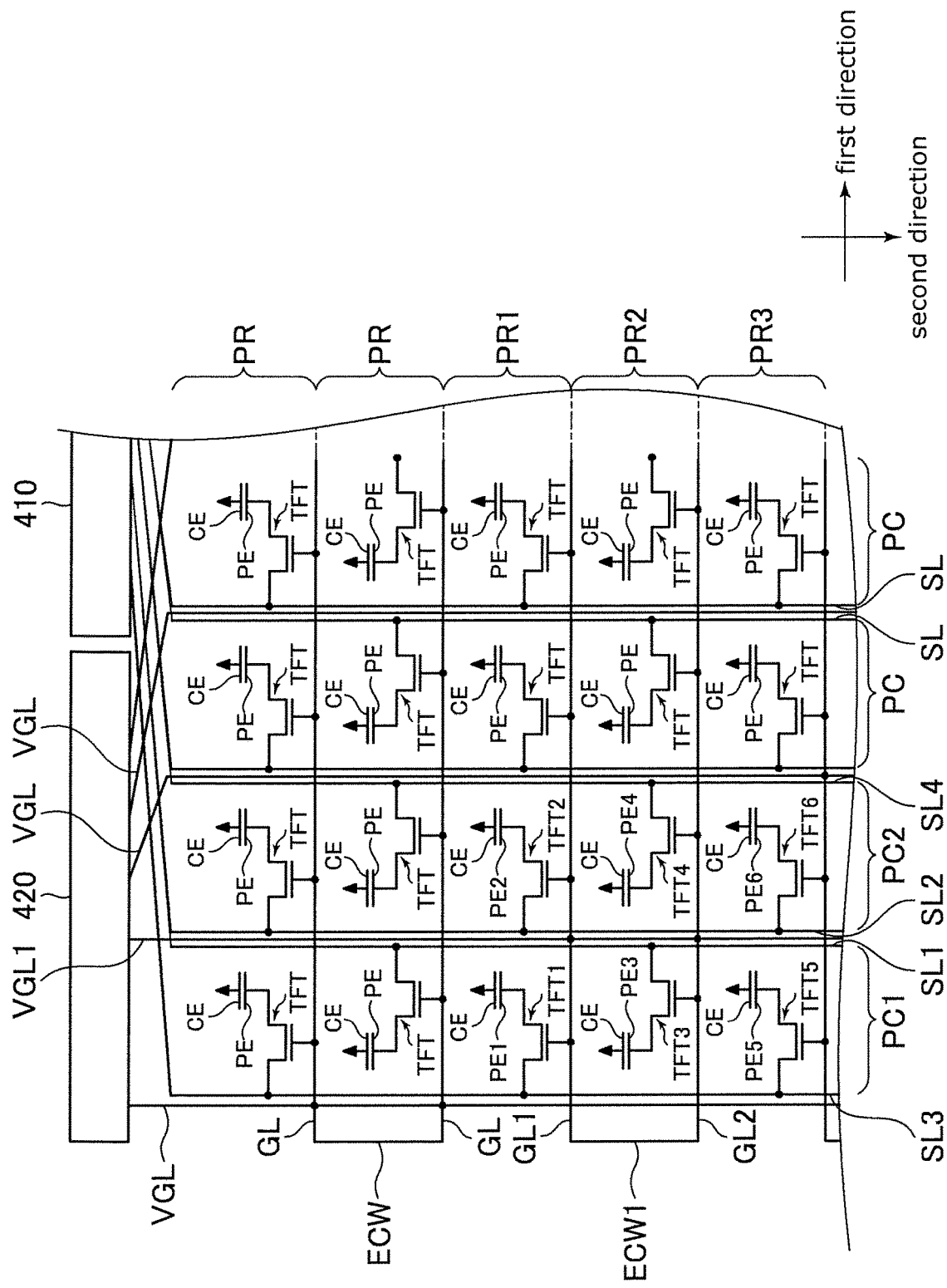
FIG. 3 is a circuit diagram showing a schematic configuration of pixel regions of display panel in display device according to the first exemplary embodiment.

FIG. 3 is a circuit diagram showing a schematic configuration of pixel regions of display panel 200 in the present exemplary embodiment. As shown in FIG. 3, display device 100 includes a plurality of gate lines GL (GL1, GL2, etc.). The plurality of gate lines GL are arranged at substantially equal intervals in a second direction intersecting a first direction, and extend in the first direction to cross among a plurality of pixels.

Further, the plurality of gate lines GL are electrically connected to a plurality of gate lead lines VGL (VGL1, etc.) extending in the second direction. A gate signal is supplied from gate driver 420 via gate lead line VGL to gate line GL. For example, as shown in FIG. 3, first gate lead line VGL1 is connected to first gate line GL1 and second gate line GL2. A common gate signal is supplied from gate driver 420 via first gate lead line VGL1 to first gate line GL1 and second gate line GL2.

Such a configuration allows a decrease in the aperture ratio to be suppressed. That is, with the above configuration, all gate lines GL can be supplied with gate signal only by connecting one gate lead line VGL to two adjacent gate lines GL out of the plurality of gate lines GL extending in the second direction. Therefore, a number of gate lead lines VGL extending in display panel 200 can be halved and a decrease in the aperture ratio can be suppressed.

In the present exemplary embodiment, first gate line GL1 and second gate line GL2 are connected to each other by first end connecting wiring ECW1 at an end region of first gate line GL1 and second gate line GL2. In this way, the further existence of first end connecting wiring ECW1 that connects first gate line GL1 and second gate line GL2 allows both first gate line GL1 and second gate line GL2 to be supplied with a common gate signal via first end connecting wiring ECW1 even when first gate line GL1 or second gate line GL2 has a connection failure with first gate lead line VGL1.

As shown in FIG. 3, display device 100 includes a plurality of source lines SL (SL1, SL2, SL3, SL4, etc.) and source driver 410 that supplies source signal to source lines SL. Each source line SL is connected to source driver 410 and extends in the second direction to cross among the plurality of pixels. More specifically, two source lines SL extend in the second direction between pixels.

In display region 300 of display panel 200, a plurality of pixel regions partitioned by the plurality of gate lines GL and the plurality of source lines SL are arranged in a matrix. As shown in FIG. 3, display panel 200 includes a plurality of pixel electrodes PE (PE1, PE2, PE3, PE4, PE5, PE6, etc.) formed in the plurality of pixel regions, common electrodes CE corresponding to the plurality of pixel electrodes PE, and a plurality of thin film transistors TFT (TFT1, TFT2, TFT3, TFT4, TFT5, TFT6, etc.) formed near intersections of each gate line GL and each source line SL. Common electrode CE is supplied with a common potential.

As shown in FIG. 3, a group of the plurality of pixel electrodes PE arranged in the first direction constitutes pixel rows PR (PR1, PR2, PR3, etc.). In the present exemplary embodiment, a pixel row including first pixel electrode PE1 and second pixel electrode PE2 arranged in the first direction is referred to as first pixel row PR1. A pixel row including third pixel electrode PE3 and fourth pixel electrode PE4 arranged in the first direction is referred to as second pixel row PR2. A pixel row including fifth pixel electrode PE5 and sixth pixel electrode PE6 arranged in the first direction is referred to as third pixel row PR3. First pixel row PR1, second pixel row PR2, and third pixel row PR3 are disposed in the second direction in this order. Thus, second pixel row PR2 is adjacent to first pixel row PR1 in the second direction, and third pixel row PR3 is adjacent to second pixel row PR2 in the second direction.

As shown in FIG. 3, a group of the plurality of pixel electrodes PE arranged in the second direction constitutes pixel columns PC (PC1, PC2, etc.). In the present exemplary embodiment, a pixel column including first pixel electrode PE1, third pixel electrode PE3, and fifth pixel electrode PE5 arranged in the second direction is referred to as first pixel column PC1. A pixel column including second pixel electrode PE2, fourth pixel electrode PE4, and sixth pixel electrode PE6 arranged in the second direction is referred to as second pixel column PC2. First pixel column PC1 and second pixel column PC2 are adjacent to each other in the first direction.

First source line SL1 and second source line SL2 extend in the second direction between first pixel column PC1 and second pixel column PC2. That is, first source line SL1 and second source line SL2 extend in the second direction between first pixel electrode PE1 and second pixel electrode PE2, between third pixel electrode PE3 and fourth pixel electrode PE4, and between fifth pixel electrode PE5 and sixth pixel electrode PE6. First source line SL1 is disposed closer to first pixel column PC1 than second source line SL2 is. Second source line SL2 is disposed closer to second pixel column PC2 than first source line SL1 is. That is, first source line SL1 is disposed closer to first pixel electrode PE1 than second source line SL2 is. Second source line SL2 is disposed closer to second pixel electrode PE2 than first source line SL1 is.

Third pixel electrode PE3 is electrically connected to first source line SL1 via third thin film transistor TFT3. Second pixel electrode PE2 and sixth pixel electrode PE6 are electrically connected to second source line SL2 via second thin film transistor TFT2 and sixth thin film transistor TFT6, respectively.

Third source line SL3 extending in the second direction is disposed on the left side of first pixel column PC1 such that first pixel column PC1 lies between third source line SL3 and first source line SL1. First pixel electrode PE1 and fifth pixel electrode PE5 are electrically connected to third source line SL3 via first thin film transistor TFT1 and fifth thin film transistor TFT5, respectively.

Fourth source line SL4 extending in the second direction is disposed on the right side of second pixel column PC2 such that second pixel column PC2 lies between fourth source line SL4 and second source line SL2. Fourth pixel electrode PE4 is electrically connected to fourth source line SL4 via fourth thin film transistor TFT4.

First gate line GL1 extends in the first direction between first pixel row PR1 and second pixel row PR2, that is, between first pixel electrode PE1 and third pixel electrode PE3 and between second pixel electrode PE2 and fourth pixel electrode PE4. Second gate line GL2 extends in the first direction between second pixel row PR2 and third pixel row PR3, that is, between third pixel electrode PE3 and fifth pixel electrode PE5 and between fourth pixel electrode PE4 and sixth pixel electrode PE6.

First pixel electrode PE1 and second pixel electrode PE2 are electrically connected to first gate line GL1 via first thin film transistor TFT1 and second thin film transistor TFT2, respectively. Third pixel electrode PE3 and fourth pixel electrode PE4 are electrically connected to second gate line GL2 via third thin film transistor TFT3 and fourth thin film transistor TFT4, respectively.

In the present exemplary embodiment, another end connecting wiring ECW connects two gate lines GL adjacent to each other in the second direction as with first end connecting wiring ECW1.

Such a configuration allows desired brightness to be reproduced in each pixel even in a high-precision, large-screen display device. Usually, in a high-precision display device, a writing time for which a gate signal is supplied to one gate line GL is shortened. That is, a pulse width of the gate signal is reduced. Further, in a large-screen display device, sufficient writing might be difficult due to a delay caused by increase in gate resistance and capacitance. To address this problem, a common gate signal is input to two gate lines GL as described above. Thus, the above-described writing time and the pulse width of a gate signal can be doubled. As a result, desired brightness can be reproduced in each pixel even in a high-precision, large-screen display device.

In particular, when a gate signal is supplied from gate driver 420 via gate lead line VGL to gate line GL, both a capacitance value and a resistance value are increased due to gate lead line VGL intervening in a signal transmission path. Thus, a voltage supplied to each pixel electrode PE might be insufficient. However, the above-described configuration allows the writing time to be doubled. Therefore, shortage of a supply voltage can be suppressed.

FIG. 3 shows an example in which one gate lead line VGL extends in the second direction between two source lines SL that extend between two adjacent pixel columns PC. For example, first gate lead line VGL1 extends in the second direction between first source line SL1 and second source line SL2 that extend between first pixel column PC1 and second pixel column PC2. In such a configuration, it is desirable to dispose spacer PS, described above with reference to FIG. 2 and retaining the gap between thin film transistor substrate 230 and counter substrate 240, in a region where two source lines SL and one gate lead line VGL extend in the second direction, that is, between two adjacent pixel columns PC. The reason is that the region where two source lines SL and one gate lead line VGL extend in the second direction overlaps a black matrix included in counter substrate 240 in planar view and thus the position of spacer PS does not cause a decrease in the aperture ratio.

Note that the present disclosure is not limited to the implementation example in which gate lead line VGL is disposed between two adjacent source lines SL. Hereinafter, an example in which gate lead line VGL overlaps pixel electrode PE in planar view will be described with reference to FIG. 4.

Figure 4:
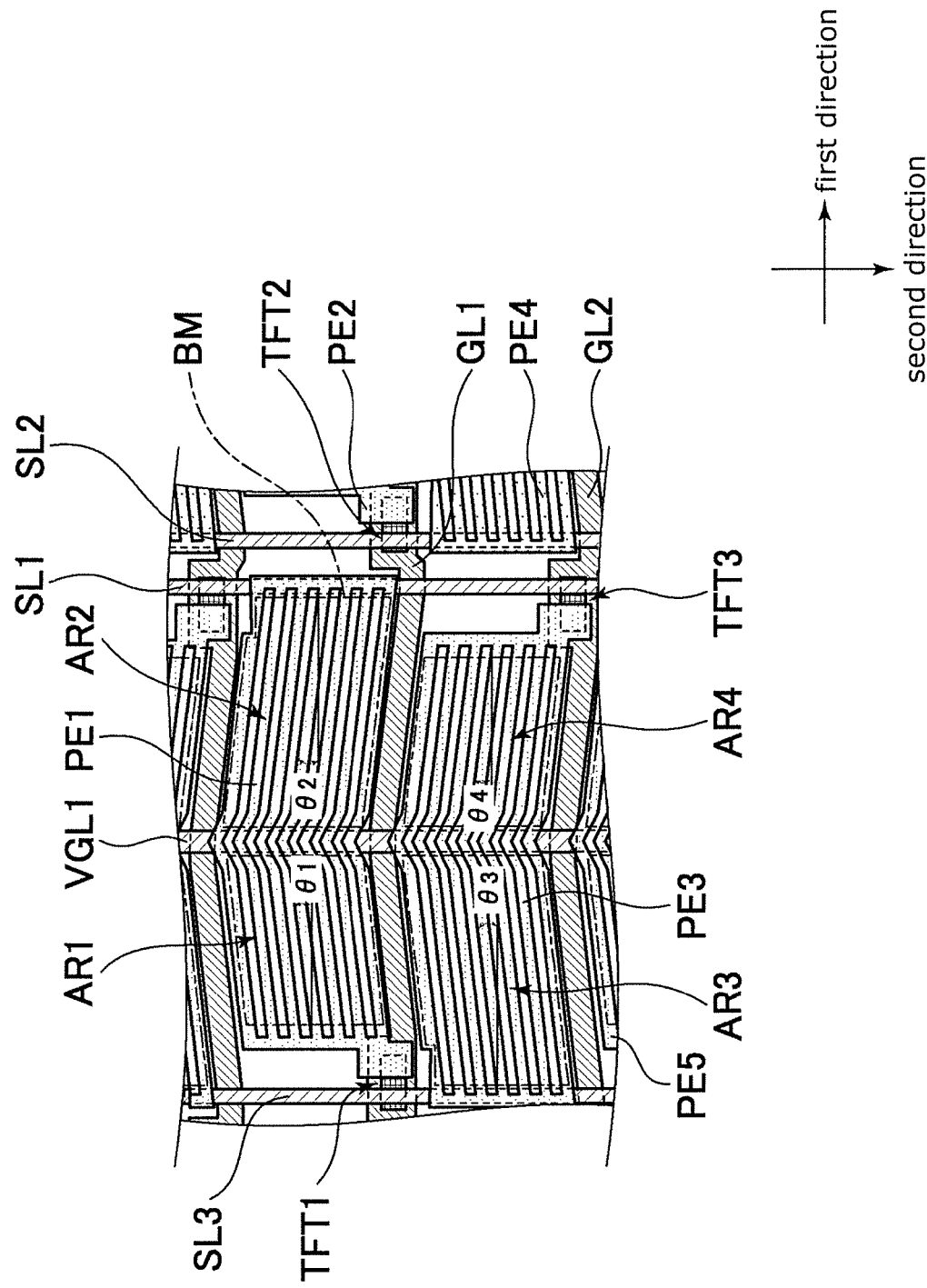
FIG. 4 is a schematic plan view showing a positional relationship between pixel electrode and gate lead line in display device according to the first exemplary embodiment.

FIG. 4 is a schematic plan view showing a positional relationship between pixel electrode PE and gate lead line VGL in the present exemplary embodiment. As shown in FIG. 4, first gate line GL1 extending in the first direction is disposed between first pixel electrode PE1 and third pixel electrode PE3 and between second pixel electrode PE2 and fourth pixel electrode PE4. Second gate line GL2 extending in the first direction is disposed between third pixel electrode PE3 and fifth pixel electrode PE5.

Further, first source line SL1 and second source line SL2 extending in the second direction are disposed between first pixel electrode PE1 and second pixel electrode PE2 and between third pixel electrode PE3 and fourth pixel electrode PE4. Third source line SL3 is disposed on the left side of first pixel electrode PE1 and third pixel electrode PE3 such that first pixel electrode PE1 and third pixel electrode PE3 lie between first source line SL1 and third source line SL3.

As shown in FIG. 4, first gate line GL1, third source line SL3, and first pixel electrode PE1 are electrically connected to first thin film transistor TFT1. Second gate line GL2, first source line SL1, and third pixel electrode PE3 are electrically connected to third thin film transistor TFT3.

In the example shown in FIG. 4, each pixel electrode PE has an outer shape with a maximum width in the second direction smaller than a maximum width in the first direction. For example, pixel electrodes corresponding to three color filters of red, green, and blue included in a color filter substrate are arranged in the second direction. For example, when first pixel electrode PE1 overlaps a red color filter in planar view, third pixel electrode PE3 overlaps a blue or green color filter in planar view.

Such a configuration allows a number of source lines SL to be reduced and thus allows a number of source drivers 410 that are expensive compared to gate driver 420 to be reduced. Therefore, costs can be reduced. For example, the number of source lines SL can be reduced to one-third compared to a configuration in which each pixel electrode PE has an outer shape with a maximum width in the second direction larger than a maximum width in the first direction, and pixel electrodes corresponding to the three color filters of red, green, and blue included in the color filter substrate are arranged in the first direction.

Meanwhile, the configuration shown in FIG. 4 requires an increase in a number of gate lead lines VGL. For example, the number of gate lead lines VGL has to be increased typically threefold compared to the configuration in which each pixel electrode PE has an outer shape with a maximum width in the second direction larger than a maximum width in the first direction, and pixel electrodes corresponding to the three color filters of red, green, and blue included in the color filter substrate are arranged in the first direction. However, in the present exemplary embodiment, the number of gate lead lines VGL can be halved by the configuration described above in which a common gate signal is input to two gate lines GL adjacent to each other in the second direction. Therefore, it is sufficient to increase the number of gate lead lines VGL 1.5-fold.

Further, the above-described configuration can achieve a configuration suitable for general full high definition (HD). For example, a full-HD configuration in which 1920 pixels are arranged in the first direction and 1080 pixels are arranged in the second direction requires 3240 (=1080×3) gate lines GL when each pixel electrode PE has an outer shape with a maximum width in the second direction smaller than a maximum width in the first direction, and pixel electrodes corresponding to the three color filters of red, green, and blue included in the color filter substrate are arranged in the second direction. When gate lead lines VGL corresponding to all gate lines GL are extended in the second direction, the number of gate lead lines VGL (3240) exceeds the number of pixels (1920 pixels) arranged in the first direction. Thus, when gate lead line VGL is extended between two adjacent pixels, a plurality of gate lead lines VGL have to be disposed between the two pixels, which results in a decrease in the aperture ratio. Alternatively, when gate lead line VGL is extended to overlap pixel electrode PE in planar view, a plurality of gate lead lines VGL have to be disposed to overlap one pixel electrode PE in planar view, which similarly results in a decrease in the aperture ratio.

Meanwhile, in the present exemplary embodiment, a common gate signal is input to two gate lines GL and thus the number of gate lead lines VGL can be halved. Accordingly, the number of gate lead lines VGL extending in the second direction can be 1620 (=1080×3 2) and smaller than the number of pixels (1920 pixels) arranged in the first direction. Therefore, a decrease in the aperture ratio can be suppressed. That is, when gate lead line VGL is extended between two adjacent pixels, it is sufficient that one gate lead line VGL is disposed between the two pixels. When gate lead line VGL is extended to overlap pixel electrode PE in planar view, it is sufficient that one gate lead line VGL is disposed to overlap one pixel electrode PE in planar view.

In the present exemplary embodiment, first pixel electrode PE1 has first area AR1 extending at first angle θ1 with respect to the first direction and second area AR2 extending at second angle θ2 different from first angle θ1 with respect to the first direction. First pixel electrode PE1 is bent at a boundary between first area AR1 and second area AR2. First gate lead line VGL1 overlaps the boundary region in planar view.

Directions of rotation of liquid crystal in first area AR1 and second area AR2 are reversed when an electric field is applied. Thus, the liquid crystal does not rotate at the boundary between first area AR1 and second area AR2 even when an electric field is applied, and the boundary region does not contribute to the aperture ratio of the pixel. Accordingly, it is desirable that first gate lead line VGL1 is disposed to overlap the boundary region that does not contribute to the aperture ratio in planar view since the existence of first gate lead line VGL1 does not cause a decrease in the aperture ratio. In the example shown in FIG. 4, black matrix BM is disposed to overlap, in planar view, not only the regions between two pixel electrodes PE adjacent to each other in the first direction and between two pixel electrodes PE adjacent to each other in the second direction, but also the boundary region between first area AR1 and second area AR2 in pixel electrode PE.

Such a configuration allows a distance to be narrowed between first source line SL1 and second source line SL2 compared to the configuration in FIG. 3 in which first gate lead line VGL1 is disposed between first source line SL1 and second source line SL2 since first gate lead line VGL1 does not have to be disposed between first source line SL1 and second source line SL2. Therefore, a decrease in the aperture ratio can be suppressed.

Further, when first source line SL1 and second source line SL2 are disposed in a layer equal to a layer where first gate lead line VGL1 is disposed or when first source line SL1 and second source line SL2 are disposed in a layer different from a layer where first gate lead line VGL1 is disposed, but close to first gate lead line VGL1 in a direction perpendicular to thin film transistor substrate 230, parasitic capacitance is generated between first source line SL1 and first gate lead line VGL1 and between second source line SL2 and first gate lead line VGL1. However, first gate lead line VGL1 is disposed to overlap the boundary region between first area AR1 and second area AR2 in planar view, which allows first gate lead line VGL1 to be disposed away from first source line SL1 and second source line SL2 in the first direction. Therefore, the generation of parasitic capacitance between first source line SL1 and first gate lead line VGL1 and between second source line SL2 and first gate lead line VGL1 can be suppressed.

As shown in FIG. 4, third pixel electrode PE3 includes third area AR3 extending at third angle θ3 with respect to the first direction, and fourth area AR4 extending at fourth angle θ4 different from third angle θ3 with respect to the first direction. Third angle θ3 may be equal to first angle θ1 in first area AR1. Fourth angle θ4 may be equal to second angle θ2 in second area AR2.

Figure 5:
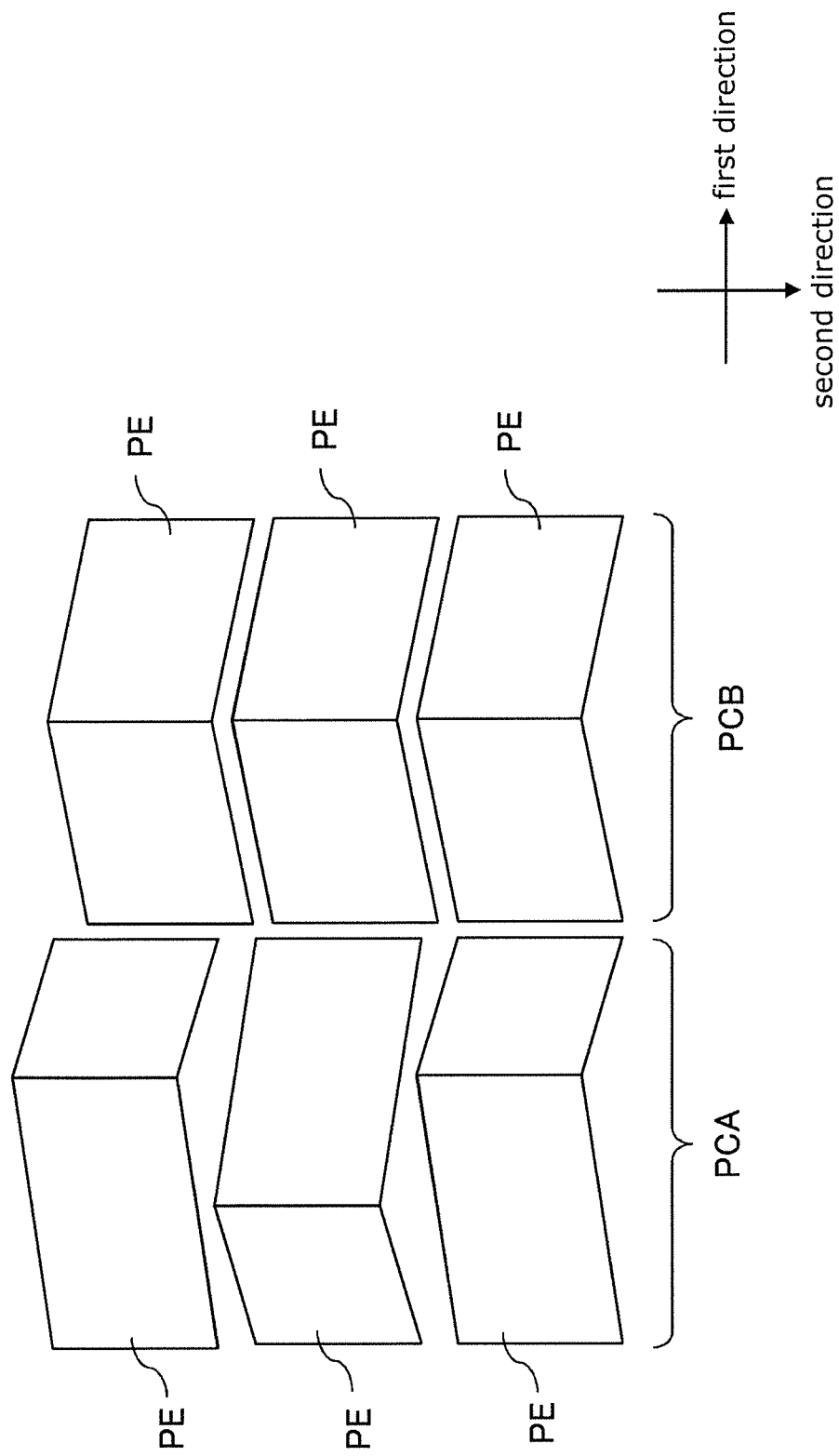
FIG. 5 is a schematic plan view showing arrangements of pixel electrodes in display device according to another implementation example in the first exemplary embodiment.

Herein, as shown in FIG. 4, desirably, the boundary between first area AR1 and second area AR2 is arranged in line with the boundary between third area AR3 and fourth area AR4. FIG. 5 is a schematic plan view showing arrangements of pixel electrodes PE. FIG. 5 shows that pixel column PCA where boundary regions at which the extending directions differ are not arranged in line with each other is large in the second direction compared to pixel column PCB where the boundary regions are arranged in line with each other since pixel column PCA has dead space between pixel electrodes PE adjacent to each other in the second direction. As a result, the aperture ratio of pixel column PCA is lower than the aperture ratio of pixel column PCB. Accordingly, as shown in FIG. 4, with the configuration in which boundary regions in pixel electrodes PE in the same pixel column PC are desirably arranged in line with each other, pixel electrodes PE adjacent to each other in the second direction can get closer to each other and a decrease in the aperture ratio can be suppressed.

Further, in the configuration shown in FIG. 4, since boundary regions in pixel electrode PE in the same pixel column PC are desirably arranged in line with each other, gate lead line VGL does not have to be bent. That is, first gate lead line VGL1 shown in FIG. 4 is disposed to overlap the boundary between third area AR3 and fourth area AR4 in planar view, and extends straight from the boundary between first area AR1 and second area AR2 in first pixel electrode PE1 to the boundary between third area AR3 and fourth area AR4 in third pixel electrode PE3. Therefore, no space for first gate lead line VGL1 to be bent and extended in the first direction is required between first pixel electrode PE1 and third pixel electrode PE3. In other words, first gate lead line VGL1 does not have to run parallel to first gate line GL1 between first pixel electrode PE1 and third pixel electrode PE3. As a result, a decrease in the aperture ratio can be suppressed.

In the configuration shown in FIG. 4, spacer PS, described above with reference to FIG. 2 and retaining the gap between thin film transistor substrate 230 and counter substrate 240, is desirably disposed by utilizing a region between pixel electrodes PE adjacent to each other in the second direction, for example between first pixel electrode PE1 and second pixel electrode PE2. The reason is that the region between pixel electrodes PE adjacent to each other in the second direction overlaps the black matrix included in counter substrate 240 in planar view and thus the position of spacer PS does not cause a decrease in the aperture ratio.

Figure 6:
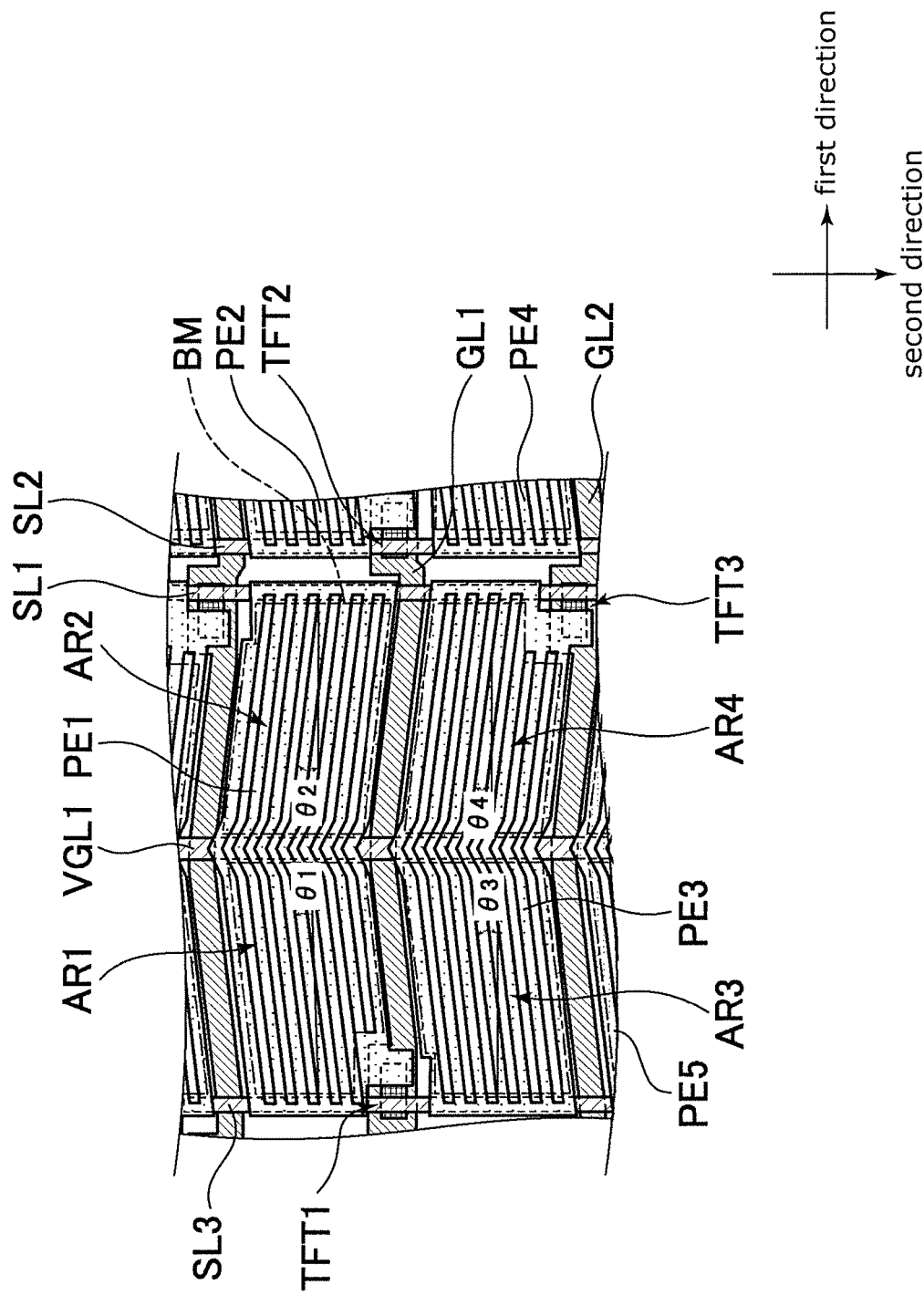
FIG. 6 is a schematic plan view showing a positional relationship between pixel electrode and gate lead line in display device according to another implementation example in the first exemplary embodiment.

To further increase the aperture ratio, pixel electrode PE is desirably elongated to the vicinity of source line SL as shown in FIG. 6. In a configuration shown in FIG. 6, first pixel electrode PE1 is elongated to the vicinity of third source line SL3. Therefore, the aperture ratio can be improved compared to the configuration shown in FIG. 4. Similarly, in the configuration shown in FIG. 6, third pixel electrode PE3 is elongated to the vicinity of first source line SL1. Therefore, the aperture ratio can be improved compared to the configuration shown in FIG. 4.

As shown in FIG. 6, in first pixel electrode PE1, a maximum width in the first direction of first area AR1 is desirably equal to a maximum width in the first direction of second area AR2. Therefore, deterioration of viewing angle characteristic can be suppressed. Similarly, in third pixel electrode PE3, a maximum width in the first direction of third area AR3 is desirably equal to a maximum width in the first direction of fourth area AR4. Therefore, deterioration of viewing angle characteristic can be suppressed.

Figure 7:
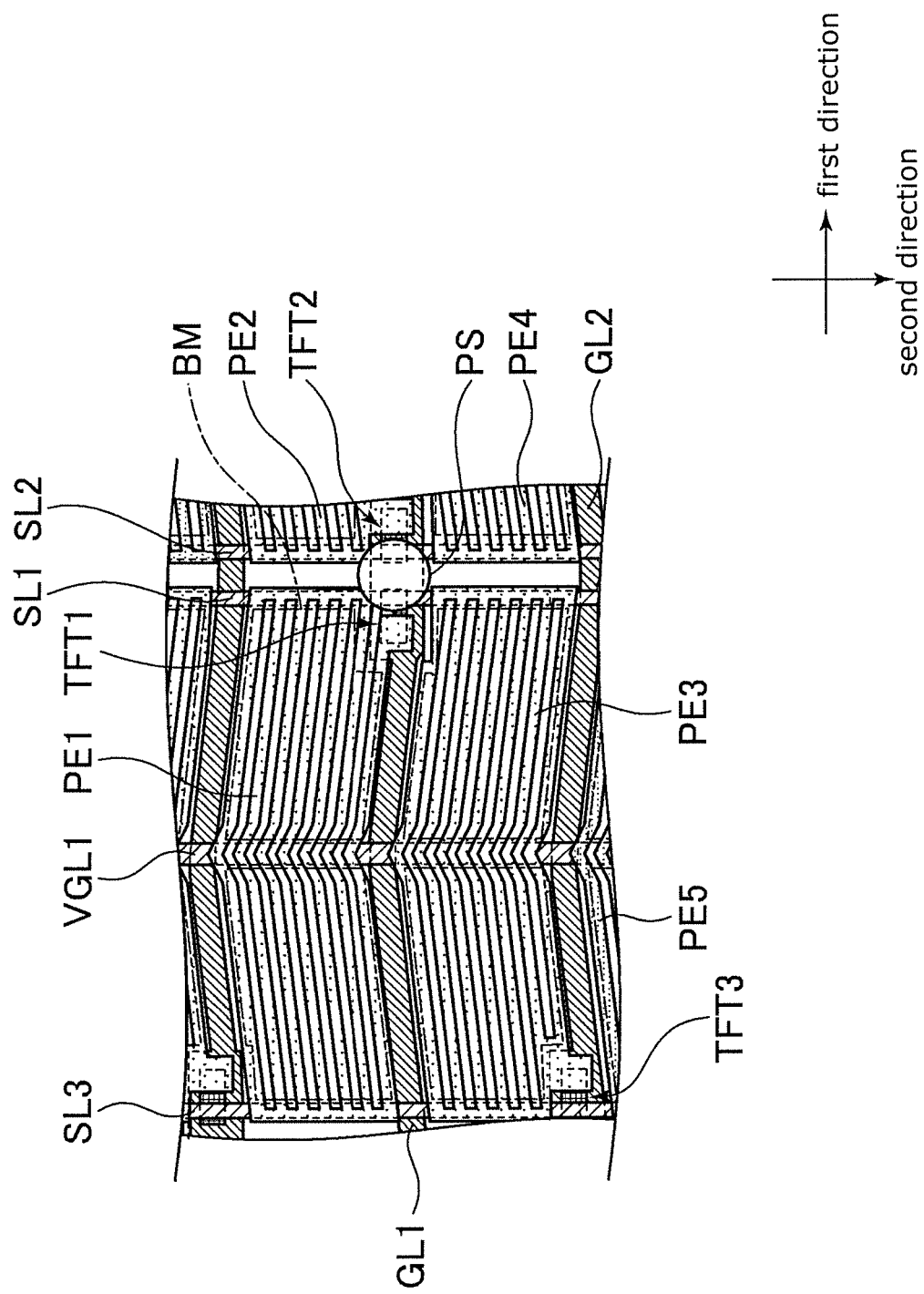
FIG. 7 is a schematic plan view showing a positional relationship between pixel electrode and gate lead line in display device according to another implementation example in the first exemplary embodiment.
Figure 8:
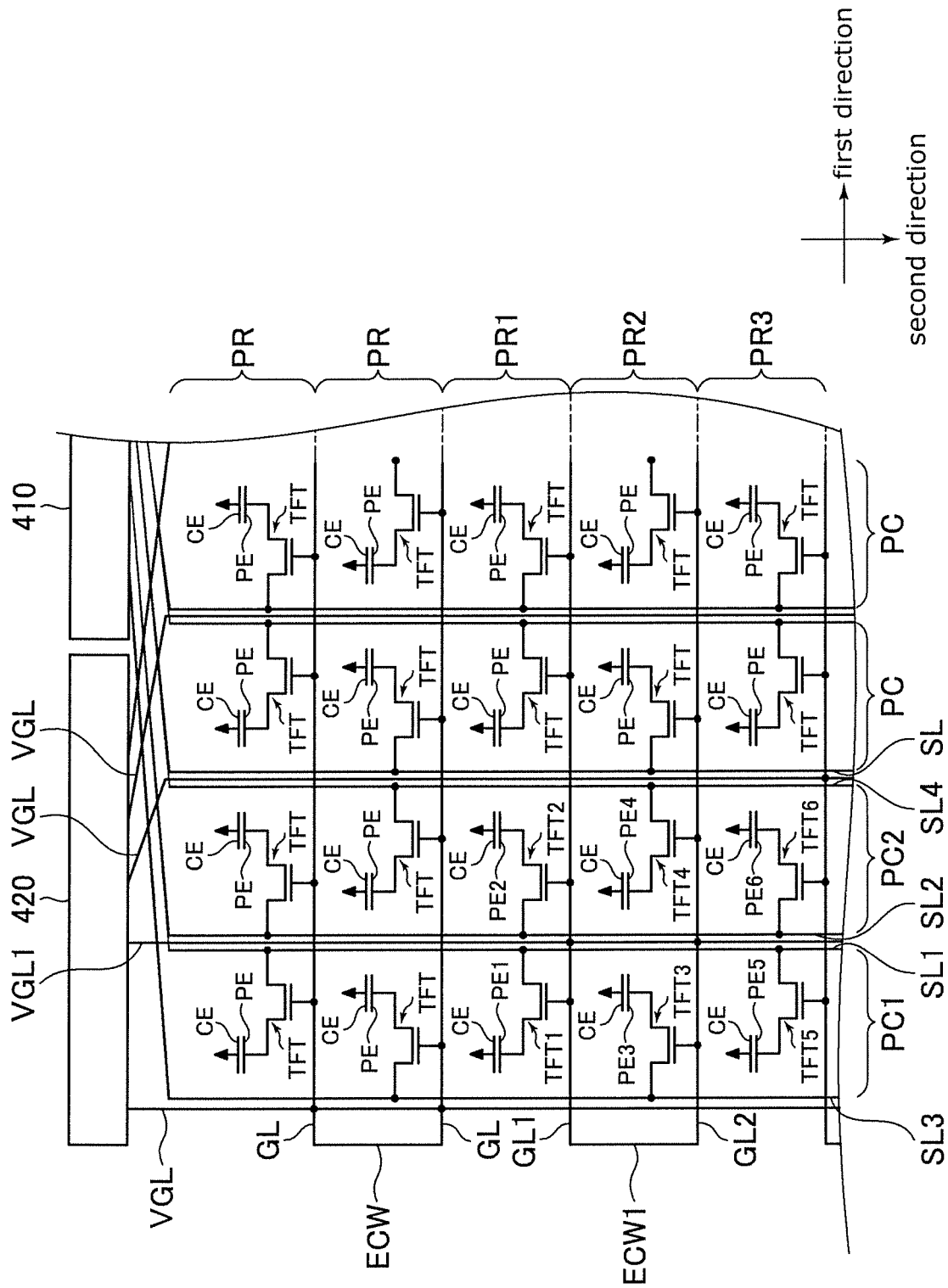
FIG. 8 is a circuit diagram showing a schematic configuration of pixel regions of display panel in display device according to another implementation example in the first exemplary embodiment.

Note that a configuration shown in FIGS. 7 and 8 is desirable as a configuration for securing a disposition region of spacer PS while improving the aperture ratio. FIG. 7 is a schematic plan view showing a positional relationship between pixel electrode PE and gate lead line VGL in another implementation example of the present exemplary embodiment. FIG. 8 is a circuit diagram showing a schematic configuration of pixel regions of display panel 200 in another implementation example of the present exemplary embodiment.

As shown in FIGS. 7 and 8, first gate line GL1 extending in the first direction is disposed between first pixel electrode PE1 and third pixel electrode PE3 and between second pixel electrode PE2 and fourth pixel electrode PE4. Second gate line GL2 extending in the first direction is disposed between third pixel electrode PE3 and fifth pixel electrode PE5 and between fourth pixel electrode PE4 and sixth pixel electrode PE6. First gate line GL1 and second gate line GL2 are connected to first gate lead line VGL1 and are supplied with a common gate signal from gate driver 420 via first gate lead line VGL1. In the present exemplary embodiment, first gate line GL1 and second gate line GL2 are connected to each other by first end connecting wiring ECW1 at end regions of first gate line GL1 and second gate line GL2.

Further, as shown in FIGS. 7 and 8, first source line SL1 and second source line SL2 extending in the second direction are disposed between first pixel electrode PE1 and second pixel electrode PE2 and between third pixel electrode PE3 and fourth pixel electrode PE4.

In the example shown in FIGS. 7 and 8, first thin film transistor TFT1 electrically connected to first pixel electrode PE1 is electrically connected to first gate line GL1 and first source line SL1. Further, second thin film transistor TFT2 electrically connected to second pixel electrode PE2 is electrically connected to first gate line GL1 and second source line SL2.

As shown in FIG. 7, spacer PS is disposed to overlap at least a part of first thin film transistor TFT1 and at least a part of second thin film transistor TFT2 in planar view.

In the example shown in FIG. 7, black matrix BM is disposed to overlap, in planar view, regions between two pixel electrodes PE adjacent to each other in the first direction and between two pixel electrodes PE adjacent to each other in the second direction. Black matrix BM is disposed to overlap first thin film transistor TFT1, second thin film transistor TFT2, and spacer PS in planar view.

Such a configuration allows positions of disposing first thin film transistor TFT1 and second thin film transistor TFT2 to be collected into intersecting regions of first gate line GL1 and first source line SL1, and first gate line GL1 and second source line SL2. These positions of disposing first thin film transistor TFT1 and second thin film transistor TFT2 do not inherently contribute to the aperture ratio. Thus, spacer PS is disposed to straddle the positions of disposing first thin film transistor TFT1 and second thin film transistor TFT2. This allows, while suppressing a decrease in the aperture ratio, spacer PS having such a size as to straddle the positions of disposing first thin film transistor TFT1 and second thin film transistor TFT2 to be disposed. Therefore, occurrence of display unevenness can be suppressed.

FIG. 2 is a schematic sectional view showing a section along the first direction of a region shown in FIG. 7 where spacer PS is disposed. Display panel 200 includes thin film transistor substrate 230 disposed on the back surface side, counter substrate 240 disposed on a display surface side and facing thin film transistor substrate 230, and liquid crystal layer 250 held between thin film transistor substrate 230 and counter substrate 240. Spacer PS protrudes from the back surface side of counter substrate 240 toward thin film transistor substrate 230.

Thin film transistor substrate 230 includes glass substrate 231, first gate line GL1 formed on the display surface side of glass substrate 231, and gate insulator 237 covering first gate line GL1. On the display surface side of gate insulator 237, first semiconductor layer SEM1 constituting a part of first thin film transistor TFT1 and second semiconductor layer SEM2 constituting a part of second thin film transistor TFT2 are formed. On the display surface side of first semiconductor layer SEM1, first source line SL1 and first source electrode SM1 are formed. On the display surface side of second semiconductor layer SEM2, second source line SL2 and second source electrode SM2 are formed.

On the display surface side of gate insulator 237, insulating film 233 is formed to cover first semiconductor layer SEM1, first source line SL1, first source electrode SM1, second semiconductor layer SEM2, second source line SL2, and second source electrode SM2. On the display surface side of insulating film 233, insulating film 234 is formed. On the display surface side of insulating film 234, first pixel electrode PE1 and second pixel electrode PE2 are formed. First pixel electrode PE1 and second pixel electrode PE2 penetrate parts of insulating film 234 and insulating film 233, and are respectively connected to first source electrode SM1 and second source electrode SM2 via an opening of a common electrode (not illustrated). On the display surface side of insulating film 234, first pixel electrode PE1, and second pixel electrode PE2, alignment film 235 is formed. On the back surface side of glass substrate 231, polarizing plate 236 is formed.

Counter substrate 240 includes black matrix BM formed on glass substrate 241. Black matrix BM is disposed to overlap first semiconductor layer SEM1, second semiconductor layer SEM2, spacer PS, and first gate line GL1 in planar view. Thus, black matrix BM is continuously formed from a region where first semiconductor layer SEM1 is formed to a region where second semiconductor layer SEM2 is formed. Counter substrate 240 further includes overcoat film 242 formed to cover the back surface side of black matrix BM and color filters (not illustrated), and alignment film 243 formed on the back surface side of overcoat film 242. On the display surface side of glass substrate 241, polarizing plate 244 is formed.

Such a configuration allows, while suppressing a decrease in the aperture ratio, spacer PS having such a size as to straddle the positions of disposing first semiconductor layer SEM1 and second semiconductor layer SEM2 to be disposed. Therefore, occurrence of display unevenness can be suppressed.

In the above, the specific embodiments of the present application have been described, but the present application is not limited to the above-mentioned embodiments, and various modifications may be made as appropriate without departing from the spirit of the present application.

What is claimed is:

1. A display device comprising:
    a first pixel row including a first pixel electrode and a second pixel electrode that are arranged in a first direction;
    a second pixel row including a third pixel electrode and a fourth pixel electrode that are arranged in the first direction, the second pixel row being adjacent to the first pixel row in a second direction intersecting the first direction;

a third pixel row including a fifth pixel electrode and a sixth pixel electrode that are arranged in the first direction, the third pixel row being adjacent to the second pixel row in the second direction;

a first source line and a second source line extending in the second direction between the first pixel electrode and the second pixel electrode, between the third pixel electrode and the fourth pixel electrode, and between the fifth pixel electrode and the sixth pixel electrode;

a first gate line extending in the first direction between the first pixel row and the second pixel row;

a second gate line extending in the first direction between the second pixel row and the third pixel row;

a first thin film transistor connected to the first pixel electrode, the first gate line and the first source line;

a second thin film transistor connected to the second pixel electrode, the first gate line and the second source line;

a gate lead line extending in the second direction and connected to the first gate line and the second gate line; and a spacer disposed on a counter substrate, wherein the spacer overlaps the first thin film transistor and the second thin film transistor in planar view, and the gate lead line is disposed between the first source line and the second source line.

2. The display device according to claim 1, wherein the first pixel electrode, the second pixel electrode, the third pixel electrode, the fourth pixel electrode, the fifth pixel electrode, and the sixth pixel electrode have an outer shape with a maximum width in the second direction smaller than a maximum width in the first direction.

3. The display device according to claim 1, wherein the first pixel electrode includes:

a first area extending at a first angle with respect to the first direction; and a second area extending at a second angle different from the first angle with respect to the first direction.

4. The display device according to claim 3, wherein the third pixel electrode includes:

a third area extending at a third angle with respect to the first direction; and a fourth area extending at a fourth angle different from the third angle with respect to the first direction, and the boundary between the first area and the second area is arranged in line with a boundary between the third area and the fourth area.

5. The display device according to claim 3, wherein a maximum width in the first direction of the first area is equal to a maximum width in the first direction of the second area.

6. The display device according to claim 1, wherein the first source line is disposed closer to the first pixel electrode than the second source line is, and the second source line is disposed closer to the second pixel electrode than the first source line is.

7. The display device according to claim 1 further comprising a first end connecting wiring that connects the first gate line and the second gate line at an end of the second pixel row.

8. A display device comprising:

a first pixel row including a first pixel electrode and a second pixel electrode that are arranged in a first direction;

a second pixel row including a third pixel electrode and a fourth pixel electrode that are arranged in the first direction, the second pixel row being adjacent to the first pixel row in a second direction intersecting the first direction;

a third pixel row including a fifth pixel electrode and a sixth pixel electrode that are arranged in the first direction, the third pixel row being adjacent to the second pixel row in the second direction;

a first source line and a second source line extending in the second direction between the first pixel electrode and the second pixel electrode, between the third pixel electrode and the fourth pixel electrode, and between the fifth pixel electrode and the sixth pixel electrode;

a first gate line extending in the first direction between the first pixel row and the second pixel row;

a second gate line extending in the first direction between the second pixel row and the third pixel row; and a gate lead line extending in the second direction and connected to the first gate line and the second gate line, wherein the gate lead line is disposed between the first source line and the second source line.

* * * * *